United States Patent
Bree et al.

(10) Patent No.: US 6,175,267 B1
(45) Date of Patent: Jan. 16, 2001

(54) CURRENT COMPENSATING BIAS GENERATOR AND METHOD THEREFOR

(75) Inventors: John Bree; Timothy J. Phoenix; Joseph A. Thomsen, all of Gilbert, AZ (US)

(73) Assignee: Microchip Technology Incorporated, Chandler, AZ (US)

( * ) Notice: Under 35 U.S.C. 154(b), the term of this patent shall be extended for 0 days.

(21) Appl. No.: 09/245,034

(22) Filed: Feb. 4, 1999

(51) Int. Cl.[7] ........................................ G05F 3/02
(52) U.S. Cl. ........................ 327/541; 327/540; 327/538
(58) Field of Search ............................... 327/530, 538, 327/540, 541, 542, 543; 323/311, 312, 313

(56) References Cited

U.S. PATENT DOCUMENTS

| 4,302,718 | * | 11/1981 | Schade, Jr. ................... 327/530 |
| 4,461,992 | * | 7/1984 | Yamaguchi et al. ............ 327/513 |
| 4,780,624 | * | 10/1988 | Nicollini et al. ............... 327/581 |
| 5,384,740 | * | 1/1995 | Etoh et al. ...................... 327/543 |
| 5,530,339 | * | 6/1996 | Macrae et al. .................. 327/551 |
| 5,903,141 | * | 5/1999 | Tailliet .......................... 327/543 |

* cited by examiner

Primary Examiner—Timothy P. Callahan
Assistant Examiner—An T. Luu
(74) Attorney, Agent, or Firm—Baker Botts L.L.P.

(57) ABSTRACT

A current compensating bias generator generates a current which follows voltage. The current compensating bias generator has a bias generator circuit for generating a current. A current compensating circuit is coupled to the bias generator circuit for changing a value of the current as a voltage input to the current compensating bias generator is changed. A resistive ladder circuit is coupled to the current compensating circuit for setting a voltage level trip point for the current compensating circuit at which the current compensating circuit is used to change the value of the current.

19 Claims, 1 Drawing Sheet

CURRENT COMPENSATING BIAS GENERATOR AND METHOD THEREFOR

BACKGROUND OF THE INVENTION

1. Field of the Invention

This invention relates generally to a bias generator and, more specifically, to a bias generator and method therefor which is designed to provide a current that follows voltage such that at lower voltage levels, the current is increased.

2. Description of the Prior Art

Presently, bias generation circuits have problems operating at low voltage levels (i.e., ~2 volts). They are either totally inoperable at low voltage levels, or they provide a bias current that requires significantly longer periods of time to perform sample/hold operations as related to A/D (Analog-to-Digital) applications. Present bias generation circuits also require numerous components and consume valuable silicon real estate when used in 10 bit and 12 bit A/D operations.

Therefore, a need existed to provide an improved bias generator circuit and method therefor. The improved bias generation circuit and method must be able to operate at low voltage levels (~2 volts) as related to A/D applications without requiring significantly longer periods of conversion time. The improved bias generation circuit and method must provide for a bias current that follows voltage such that at lower voltage levels, the bias current is increased. The improved bias generation circuit and method must further be implemented using fewer components than current bias generation circuits thereby saving valuable silicon real estate.

SUMMARY OF THE INVENTION

In accordance with one embodiment of the present invention, it is an object of this invention to provide an improved bias generator circuit and method therefor.

It is another object of the present invention to provide an improved bias generation circuit and method that is able to operate at low voltage levels, as related to A/D (Analog-to-Digital) applications without requiring significantly longer periods of conversion time.

It is still another object of the present invention to provide an improved bias generation circuit and method that generates a bias current that follows voltage such that at lower voltage levels the bias current is increased.

It is still another object of the present invention to provide an improved bias generation circuit and method that increases the bias current at lower voltage levels.

It is still another object of the present invention to provide an improved bias generation circuit and method that may be implemented using fewer components than current bias generation circuits thereby saving valuable silicon real estate.

BRIEF DESCRIPTION OF THE PREFERRED EMBODIMENTS

In accordance with one embodiment of the present invention, a current compensating bias generator is disclosed. The current compensating bias generator has a bias generator circuit for generating a current. A current compensating circuit is coupled to the bias generator circuit for changing a value of the current as a voltage input to the current compensating bias generator is changed. A resistive ladder circuit is coupled to the current compensating circuit for setting a voltage level trip point for the current compensating circuit at which the current compensating circuit is used to change the value of the current.

In accordance with another embodiment of the present invention, a method of providing a current compensating bias generator is disclosed. The method comprises the steps of:

providing a bias generator circuit for generating a current;

providing a current compensating circuit coupled to the bias generator circuit for changing a value of the current as a voltage input to the current compensating bias generator is changed; and providing a resistive ladder circuit coupled to the current compensating circuit for setting a voltage level trip point at which the current compensating circuit is to change the value of the current.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
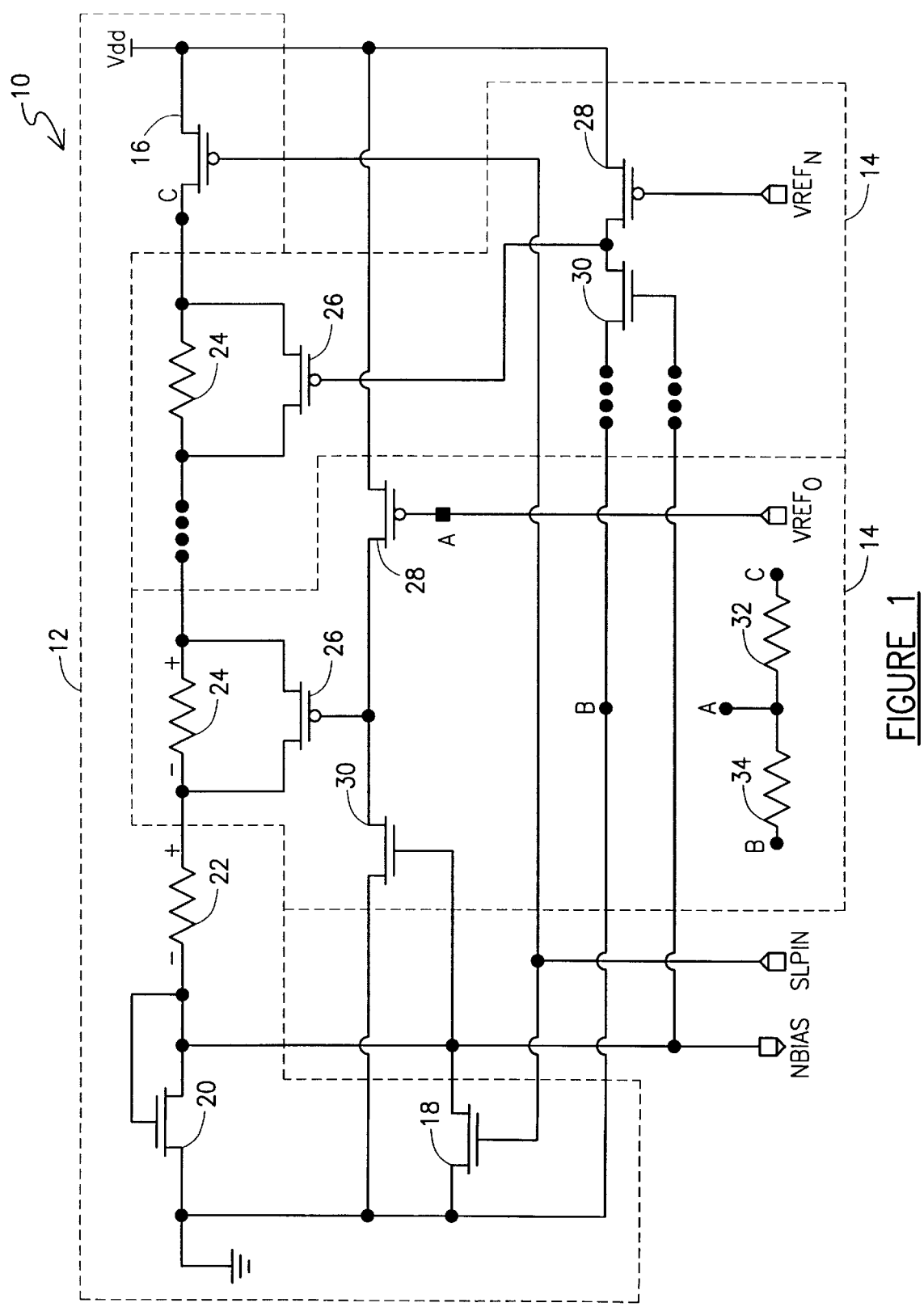
FIG. 1 is an electrical schematic of the current compensating bias generator of the present invention.

Referring to FIG. 1, a current compensating bias generator 10 (hereinafter bias generator 10) is shown. The bias generator 10 is comprised of a bias generation circuit 12, and at least one current compensation circuit 14. The bias generation circuit 12 is used to generate a bias current. Each current compensation circuit 14 is used to increase or decrease the level of the bias current generated by the bias generation circuit 12. Each current compensation circuit 14 is used to alter the resistive value in the bias generation circuit 12. By altering the value of the resistive value in the bias generation circuit 12, one may increase or decrease the level of the bias current generated by the bias generation circuit 12.

The bias generation circuit 12 may be any type of circuit which is used to generate a bias current. In the embodiment depicted in FIG. 1, the bias generation circuit 12 has a switching device. The switching device is used to prevent current contribution when the bias generator 10 is in a sleep mode. In the embodiment depicted in FIG. 1, the switching device is comprised of two transistors 16 and 18. The transistor 16 has a first terminal coupled to a voltage supply Vdd, a second terminal coupled to the second transistor 18, and a third terminal coupled to the last current compensation circuit 14. The second transistor 18 has a first terminal coupled to the first current compensation circuit 14, a second terminal coupled to the second terminal of the first transistor 16, and a third terminal coupled to ground. A SLEEP signal (SLPIN) is coupled to the second terminal of both the first transistor 16 and the second transistor 18. When the SLEEP signal is sent to the first transistor 16, the first transistor 16 is activated thereby preventing current contribution by the bias generation circuit 12. In the embodiment depicted in FIG. 1, the first transistor 16 is a P-channel transistor and the second transistor is an N-channel transistor. However, it should be noted that the switching device is not limited to this specific embodiment.

In the embodiment depicted in FIG. 1, the bias generation circuit 12 further has a third transistor 20. The third transistor 20 has a first terminal coupled to a resistive element 22, a second terminal coupled to the first terminal of the transistor 20, and a third terminal coupled to ground and the third terminal of the second transistor 18 of the bias generation circuit 12. In the embodiment depicted in FIG. 1, the third transistor 20 is an N-channel transistor.

The resistive element 22 has a first terminal coupled to the first current compensation circuit 14 and a second terminal coupled to the first and second terminals of the third transistor 20. The resistive element 22 is the default resistive value of the bias generation circuit 12 and is used to set the default value of the current generated by the bias generation circuit 12.

The bias generation circuit 12 may have one or more current compensation circuits 14. The current compensation circuit 14 is used to change the resistance in the bias generation circuit 12. By altering the value of the resistance in the bias generation circuit 12, the current compensation circuit 14 will alter the value of the bias current that is generated by the bias generation circuit 12. The current compensation circuit 14 will alter the resistance in the bias generation circuit 12 by adding or removing one more resistors in the bias generation circuit 12. Each current compensation circuit 14 will have a voltage trip point level at which the current compensating circuit 14 is to change the resistive level of the bias generation circuit 12. When the voltage trip point level for a specific current compensation circuit 14 is reached, that specific current compensation circuit 14 will increase the bias current by lowering the resistance in the bias generation circuit 12.

Each current compensation circuit 14 is comprised of a resistive element 24 and three transistors 26, 28, and 30 respectively. The resistive element 24 is used to alter the resistance in the bias generation circuit 12. When a voltage trip point level for a specific current compensation circuit 14 is reached, the transistors 26, 28, and 30 for that specific current compensation circuit 14 will increase the bias current by shunting out the resistive element 24.

The transistor 26 has a first terminal coupled to a first terminal of the resistive element 24, a second terminal coupled to both the transistors 28 and 30, and a third terminal coupled to a second terminal of the resistive element 24. The transistor 28 has a first terminal coupled to the voltage source Vdd, a second terminal coupled to a reference voltage $VREF_N$, and a third terminal coupled to the second terminal of the transistor 26. The reference voltage $VREF_N$ will set the voltage trip point level for each current compensating circuit 12. The transistor 30 has a first terminal coupled to both the second terminal of the transistor 26 and to the third terminal of the transistor 28, a second terminal coupled to a bias voltage NBIAS, and a third terminal coupled to the third terminal of transistor 20. In the embodiment depicted in FIG. 1, the transistors 26 and 28 are both P-channel transistors and the transistor 30 is an N-channel transistor.

The reference voltage $VREF_N$ may be any circuit which provides a known voltage such as a voltage supply or a resistive ladder circuit. As can be seen in FIG. 1 in the dashed lines, a resistive ladder circuit is comprised of two resistors 32 and 34 coupled together in series. The resistor 32 has a first terminal coupled to the third terminal of the P-channel transistor 16 and a second terminal coupled to the resistor 34 and the second terminal of the transistor 28. The resistor 34 has a first terminal coupled to the second terminal of the resistor 32 and to the second terminal of the transistor 28, and a second terminal coupled to the third terminal of transistor 20.

OPERATION

The bias generator 10 will provide a bias current that follow the voltage Vdd. At lower voltage levels, the bias current is boosted by reducing the resistance in the bias generation circuit 12. The increase in the bias current reduces the amount of time required for sample/hold operations in A/D applications. The boost in the bias current is done by sensing the voltage level at the voltage source Vdd and either enabling or disabling the current compensation circuit 14.

At low voltage levels, the P-channel transistor 26 will be turned on and held on by the N-channel transistor 30. This will effectively shunt out the resistor 24 lowering the resistance in the bias generation circuit 12 and increasing the bias current. As the voltage Vdd is raised, the potential between the drain and the gate terminals of the P-channel transistor 28 increases. When the voltage Vdd reaches a predetermined voltage level (each current compensating circuit 12 will have different voltage trip point levels), the delta between the drain and gate terminals of the P-channel transistor 28 will be sufficient to turn the P-channel transistor 28 on, passing the Vdd value. The N-channel transistor 30, which is a very weak transistor (i.e., small length to width ratio as compared to the P-channel transistor 28), is nullified by the P-channel transistor 28. This in turns disables the gate of the P-channel transistor 26. By turning off the P-channel transistor 26, the resistive element 24 is added back in series with the resistive element 22 thereby increasing the resistance in the bias generation circuit 12 and lowering the bias current when the voltage Vdd is increased.

While the invention has been particularly shown and described with reference to preferred embodiments thereof, it will be understood by those skilled in the art that the foregoing and other changes in form and details may be made therein without departing from the spirit and scope of the invention. For example, the bias generator 10 may be designed with multiple trip points (i.e., multiple resistors in the resistive ladder 16). The bias generator 10 may also be designed to have multiple stages to increase or decrease the bias current (i.e., multiple current compensation circuits 14).

What is claimed is:

1. A current compensating bias generator comprising, in combination:

a bias generator circuit for generating a current; and
   at least one current compensating circuit coupled to said bias generator circuit for charging a value of said current as a voltage input to said current compensating bias generator is changed;
   wherein said bias generator circuit comprises:
      a voltage input source;
      a resistive element coupled to said voltage input source;
      a first transistor having a first terminal coupled to said resistive element, a second terminal coupled to said first terminal of said first transistor, and a third terminal coupled to ground; and
      a switching circuit coupled to said voltage source and said first transistor for preventing said bias generator from generating said current when said current compensating bias generator is placed in a SLEEP mode.

2. A current compensating bias generator in accordance with claim 1 further comprising a plurality of current compensating circuits.

3. A current compensating bias generator in accordance with claim 1 wherein said first transistor is an N-channel transistor.

4. A current compensating bias generator in accordance with claim 1 wherein said switching circuit comprises:

a second transistor having a first terminal coupled to said voltage input source of said current compensating bias generator, a second terminal coupled to a third transistor, and a third terminal coupled to said at least one current compensating circuit; and said third transistor having a first terminal coupled to a first of said at least one current compensating circuit, a second terminal coupled to said second terminal of said second transistor, and a third terminal coupled to said third terminal of said first transistor.

5. A current compensating bias generator in accordance with claim 4 wherein said second transistor is a P-channel transistor.

6. A current compensating bias generator in accordance with claim 4 wherein said third transistor is an N-channel transistor.

7. A current compensating bias generator comprising, in combination:

a bias generator circuit for generating a current;

at least one current compensating circuit coupled to said bias generator circuit for charging a value of said current as a voltage input to said current compensating bias generator is changed;

a current compensating resistive element;

a first transistor having a first terminal coupled to a first terminal of said current compensating resistive element, and a third terminal coupled to a second terminal of said current compensating resistive element;

a second transistor having a first terminal coupled to said voltage input source, a second terminal coupled to a voltage reference source, and a third terminal coupled to a second terminal of said first transistor; and a third transistor having a first terminal coupled to said second terminal of said first transistor, a second terminal coupled to said bias generator circuit, and a third terminal coupled to said bias generator circuit.

8. A current compensating bias generator in accordance with claim 7 wherein said first transistor and said second transistor are both P-channel transistors.

9. A current compensating bias generator in accordance with claim 7 wherein said third transistor is an N-channel transistor.

10. A current compensating bias generator in accordance with claim 7 wherein said voltage reference source is a resistive ladder circuit.

11. A method of providing a current compensating bias generator comprising the steps of:

providing a bias generator circuit for generating a current, wherein said bias generator comprises
a voltage input source,
a resistive element coupled to said voltage input source, and
a first transistor having a first terminal coupled to said resistive element, a second terminal coupled to said first terminal of said first transistor, and a third terminal coupled to ground;

providing at least one current compensating circuit coupled to said bias generator circuit for changing a value of said current as a voltage input to said current compensating bias generator is changed; and providing a switching circuit coupled to said voltage source and said first transistor for preventing said bias generator from generating said current when said current compensating bias generator is placed in a SLEEP Mode.

12. The method of claim 11 wherein said first transistor is an N-channel transistor.

13. The method of claim 11 wherein said step of providing said switching circuit further comprises the steps of:

providing a second transistor having a first terminal coupled to said voltage input source of said current compensating bias generator, a second terminal coupled to a third transistor, and a third terminal coupled to said at least one current compensating circuit; and providing said third transistor having a first terminal coupled to a first of said at least one current compensating circuit, a second terminal coupled to said second terminal of said second transistor, and a third terminal coupled to said third terminal of said first transistor.

14. The method of claim 13 wherein said second transistor is a P-channel transistor.

15. The method of claim 13 wherein said third transistor is an N-channel transistor.

16. A method of providing a current compensating bias generator comprising the steps of:

providing a bias generator circuit for generating a current;

providing at least one current compensating circuit coupled to said bias generator circuit for changing a value of said current as a voltage input to said current compensating bias generator is changed;

providing a current compensating resistive element;

providing a first transistor having a first terminal coupled to a first terminal of said current compensating resistive element, and a third terminal coupled to a second terminal of said current compensating resistive element;

providing a second transistor having a first terminal coupled to said voltage input source, a second terminal coupled to a voltage reference source, and a third terminal coupled to a second terminal of said first transistor; and providing a third transistor having a first terminal coupled to said second terminal of said first transistor, a second terminal coupled to said bias generator circuit, and a third terminal coupled to said bias generator circuit.

17. The method of claim 16 wherein said first transistor and said second transistor are both P-channel transistors.

18. The method of claim 16 wherein said third transistor is an N-channel transistors.

19. The method of claim 16 wherein said voltage reference source is a resistive ladder circuit.

* * * * *